US008564274B2

(12) United States Patent
Dimitriu et al.

(10) Patent No.: US 8,564,274 B2
(45) Date of Patent: Oct. 22, 2013

(54) REFERENCE VOLTAGE GENERATION FOR SINGLE-ENDED COMMUNICATION CHANNELS

(75) Inventors: Dragos Dimitriu, Boise, ID (US); Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 258 days.

(21) Appl. No.: 12/359,299

(22) Filed: Jan. 24, 2009

(65) Prior Publication Data
US 2010/0188058 A1    Jul. 29, 2010

(51) Int. Cl.
G05F 3/04 (2006.01)
G05F 3/16 (2006.01)

(52) U.S. Cl.
USPC .......................................... 323/312; 323/313

(58) Field of Classification Search
USPC ........................... 323/233, 299, 312–316, 304
See application file for complete search history.

(56) References Cited

U.S. PATENT DOCUMENTS

| | | | | |
|---|---|---|---|---|
| 6,016,051 A * | 1/2000 | Can | ................. | 323/315 |
| 6,188,531 B1 * | 2/2001 | Chang et al. | ..................... | 360/46 |
| 6,201,379 B1 * | 3/2001 | MacQuigg et al. | ............ | 323/313 |
| 6,380,723 B1 * | 4/2002 | Sauer | ............................. | 323/315 |
| 6,515,600 B2 * | 2/2003 | Graen | ........................... | 341/118 |
| 6,539,792 B2 * | 4/2003 | Lull et al. | ................... | 73/204.15 |
| 6,788,041 B2 * | 9/2004 | Gheorghe et al. | ............. | 323/313 |
| 6,791,307 B2 * | 9/2004 | Harrison | ...................... | 323/312 |
| 6,930,507 B2 * | 8/2005 | Dreps et al. | ...................... | 326/30 |
| 6,937,180 B1 * | 8/2005 | Muratov et al. | ............... | 341/154 |
| 7,092,689 B1 * | 8/2006 | Boecker et al. | ............... | 455/260 |
| 7,336,147 B2 * | 2/2008 | Watanabe et al. | ............. | 336/200 |
| 7,791,368 B2 * | 9/2010 | Azimi et al. | ..................... | 326/33 |
| 7,863,884 B1 * | 1/2011 | Carper | .......................... | 323/313 |
| 7,880,531 B2 * | 2/2011 | Park | .............................. | 327/538 |
| 2004/0001349 A1 | 1/2004 | Perego et al. | | |
| 2006/0066351 A1 | 3/2006 | Lau | | |
| 2007/0108954 A1 * | 5/2007 | Qiu et al. | ....................... | 323/284 |
| 2008/0191669 A1 * | 8/2008 | Azimi et al. | ................... | 323/234 |
| 2008/0256414 A1 | 10/2008 | Chung et al. | | |
| 2009/0080267 A1 * | 3/2009 | Bedeschi et al. | ......... | 365/189.09 |
| 2009/0184697 A1 * | 7/2009 | Park | .............................. | 323/280 |

OTHER PUBLICATIONS

International Search Report regarding corresponding application No. PCT/US2010/020973, dated May 6, 2010.

* cited by examiner

*Primary Examiner* — Adolf Berhane
*Assistant Examiner* — Emily Pham
(74) *Attorney, Agent, or Firm* — Schwegman, Lundberg & Woessner, P.A.

(57) ABSTRACT

An improved reference voltage (Vref) generator useable, for example, in sensing data on single-ended channels is disclosed. The Vref generator can be placed on the integrated circuit containing the receivers, or may be placed off chip. In one embodiment, the Vref generator comprises an adjustable-resistance voltage divider in combination with a current source. The voltage divider is referenced to I/O power supplies Vddq and Vssq, with Vref being generated at a node intervening between the adjustable resistances of the voltage divider. The current source injects a current into the Vref node and into a non-varying Thevenin equivalent resistance formed of the same resistors used in the voltage divider. So constructed, the voltage generated equals the sum of two terms: a first term comprising the slope between Vref and Vddq, and a second term comprising a Vref offset. Each of these terms can be independently adjusted in first and second modes: the slope term via the voltage divider, and the offset term by the magnitude of the injected current. Use of the disclosed Vref generator in one useful implementation allows Vref to be optimized at two different values for Vddq.

28 Claims, 10 Drawing Sheets

REFERENCE VOLTAGE GENERATION FOR SINGLE-ENDED COMMUNICATION CHANNELS

FIELD OF THE INVENTION

Embodiments of this invention relate to an improved reference voltage generator having particular utility in sensing data in single-ended communication channels.

BACKGROUND

FIG. 1 shows a plurality of communication channels 14($x$) for communicating data between a first device 10 and a second device 12. In one embodiment the devices 10 and 12 can comprise discrete integrated circuits, such as a Synchronous Dynamic Random Access Memory (SDRAM) and a microprocessor in one example. In this example, communication channels 14($x$) would typically comprise traces in a printed circuit board (PCB) 15. Alternatively, devices 10 and 12 could comprise circuit blocks on a common substrate, with channels 14($x$) comprising traces on the substrate.

The communication channels 14($x$) as illustrated are bidirectional, allowing data to be sent from device 10 to device 12 and vice versa. When data is sent from device 10 to device 12, the transmitters TX are activated in device 10 and the receivers RX are activated in device 12. Likewise, when data is sent from device 12 to device 10, the transmitters TX are activated in device 12 and the receivers RX are activated in device 10.

As shown, each of the illustrated communication channels 14($x$) are "single-ended," meaning that the transferred data only appears at one point in a given receiver, RX. By contrast, other communication channels in the art are differential, meaning that data and its complement are transferred on two traces, with both the true and complement data values being received at a differential receiver. See, e.g., U.S. patent application Ser. No. 11/972,209, filed Jan. 10, 2008.

The received data at each receiver RX, typically implemented as amplifiers, is compared to a reference voltage, Vref. As is well known in such single-ended applications, Vref comprises a threshold, such that data having a higher voltage than Vref is interpreted by the receiver RX as a logic '1', while data having a lower voltage than Vref is interpreted as a logic '0'. Because Vref is essentially a constant voltage, the comparison of the data and Vref at the receivers is sometimes known in the art as a "pseudo differential" approach, owing to the fact the Vref is a mere threshold voltage, rather than a data complement.

Limited pin count, lower power, and the availability of legacy design work motivate the effort to increase the bandwidth of, and hence prolong the life of, single-ended signaling. While most single-ended signaling innovation targets either noise reduction through encoding techniques and supply insensitive circuit design, or bandwidth enhancement through equalization, little focus has apparently been given to techniques for reference voltage (Vref) generation, an important parameter that impacts the voltage and timing margins of the communication channels.

Vref generation became a requirement of early DDR (Double Data Rate) SDRAM standards, which specified that the Vref generator 16 comprise a simple resistor-based voltage divider (with Vref at its center point) placed on the PCB 15, as shown in FIG. 1, such that:

$$Vref=(Rb/Ra+Rb)*Vddq=m*Vddq \quad \text{(Eq. 1)}$$

where m is a scaling factor comprising the Vref voltage level relative to Vddq. As this term captures the relative nature of Vref and Vddq, it may also be seen as a "slope" or rate of change in Vref versus a corresponding rate of change in Vddq. Vref, so generated, was then distributed to all necessary components, including the receivers, RX, in the devices 10 and 12. This voltage-divider in earlier years was configured to generate a DC reference midway between Vddq and Vssq (i.e., Ra=Rb, or m=0.5), where Vddq and Vssq are the I/O power supplies for the devices 10 and 12. As one skilled in the art will understand, often the I/O power supplies Vddq and Vssq are isolated from the corresponding power supplies Vdd and Vss used internal to the devices 10 and 12. Diving the power domains in this manner help to keep noise in the communication channels 14($x$) from affecting internal signaling such as internal transmitted and received data signals DXx and DRx, which is referenced to the Vdd/Vss domain. See, e.g., U.S. patent application Ser. No. 12/208,562, filed Sep. 11, 2008.

Eventually, DDR SDRAM technology migrated to the use of Vddq-referenced signaling, in which logic '1' and '0' are referenced to Vddq, such that a logic '1' equals Vddq, and a logic '0' equals a voltage between Vddq and Vssq, but may not equal Vssq. (Vssq-referenced signaling would be similar in that a logic '0' equals Vssq, while a logic '1' equals a voltage between Vddq and Vssq, but may not equal Vddq). Such changes precipitated changes to Vref generation. First, the option of generating Vref internal to the receiving device 10 or 12 was introduced, which simplified system design, and removed the requirement of external Vref pins on the devices 10 or 12. Second, due to the fact that Vddq-referenced signaling might not produce signals with a midpoint voltage between Vddq and Vssq, the internal Vref generator 20 was designed to be capable of tuning the Vref level, such as is shown in FIG. 2. Vref generator 20 comprises a series connection of resistors Ra1-RaN between Vddq and Vref, and a series connection of resistors Rb1-RbN between Vref and Vssq. As shown, any of these resistors can be bypassed through digital control (Ta1-TaN; Tb1-TbN) to arrive at tunable values for Ra and Rb per Equation 1 above. Such tunability allowed Vref to be trained to maximize voltage and/or timing margins during channel initialization.

Optimal Vref generation in Vddq-referenced signaling preferably takes into account the relationship between transmitter TX's pull-down or pull-up drive strength and the receiver RX's on-die termination (ODT) resistance, which are shown in FIG. 3. As shown, Rpu and Rpd respectively represent the pull-up and pull-down resistances at the transmitter, while Rodt represents the receiver's resistive on-die termination to Vddq. When sending a logic '1', Rpd is effectively removed from the network, and both ends of the channel 14 are brought to the same potential (Vddq). In other words, the voltage of a transmitted logic '1' at the receiver, Vhigh, equals Vddq.

Conversely, when sending a logic '0', Rpu is removed from the network, and Rodt, the channel 14 resistance (not shown and ignored), and Rpd are connected in series between Vddq and Vssq. This voltage divider sets the voltage of a transmitted logic '0' at the receiver, Vlow, which equals Vlow=(Rpd/(Rpd+Rodt))*Vddq (assuming Vssq=0V).

From this analysis, it would appear that the optimal value for Vref would be exactly one-half of the way between Vhigh and Vlow:

$$Vref=(Rpd+0.5\ Rodt)/(Rpd+Rodt)*Vddq. \quad \text{(Eq. 2)}$$

However, this optimal value for Vref can be misleading in a realistic communication channel, which will suffer from non-idealities such as simultaneous switching output (SSO) noise, inter-symbol interference (ISI), crosstalk, and duty-cycle distortion (DCD). All of these effects combine to distort the data presented to the receiver, RX, and thus effect the level of Vref that would be optimal for a given system.

DCD in particular, which can result from pull-up/pull-down asymmetry at the transmitter and/or from a distorted data strobe, can severely alter the shape of the received data "eye," as shown in FIG. 4. (The concept of statistically analyzing data from the perspective of a data eye is well known, and is discussed further in U.S. patent application Ser. No. 11/930,524, filed Oct. 31, 2007). As one skilled in the art understands, a data eye represents a statistical picture of data reception for a given communication channel, and the internal region of the eye represents the region in which data can be accurately sensed from both a voltage margin and a timing margin perspective. A reliable communication channel would thus preferably be characterized by a data eye that is as "open" as possible, as this would maximize the margins at which the data could be sensed.

FIG. 4 shows hypothetical data eyes for a Vddq-referenced system. The first data eye shows the data integrity at a first Vddq value of 1.0V. At this level, a satisfactory and symmetrical data eye results. The maximum voltage for the eye, Vhigh, equals Vddq (1.0V) as discussed earlier. The minimum voltage, Vlow, equals some value between Vddq and Vssq, and is shown as 0.5V here for illustrative purposes. (Per the equations discussed above with respect to FIG. 3, Vlow=0.5 would be consistent, for example, in a system having a transmitter, TX, having pull-up and pull-down resistances, Rpu and Rpd, of 50Ω, transmitting into a 50Ω termination resistance (Rodt) relative to a 1V VDDQ). To accommodate such Vddq-referenced signaling, a tunable Vref voltage is desirable, and the level for Vref would logically be set to the middle of the Vhigh and Vlow values, such that, in this example, Vref=0.75*Vddq, or 0.75 V (assuming Vssq=0V). The tunable Vref generator 20 used to set this Vref value is shown at the bottom of FIG. 4, and comprises the voltage divider of Equation 1, with Rb=3*Ra, which establishes a slope m=0.75, per Equation 1.

The second data eye shows the system in the case that Vddq has degraded from 1.0V to 0.9V, which degradation could be permanent or transient. In this example, it is assumed that the P-channel devices in the transmitters TX will begin to lose their drive strength at low voltages, resulting in a distorted eye which is biased toward lower voltages and which decreases the sensing margin of the logic '1' state. Because Vhigh, Vref, and Vlow each scale with Vddq, it can be seen that these values shift accordingly to 0.9V, 0.675V, and 0.45V, respectively.

However, due to the asymmetry of the degraded eye, the designated Vref voltage of 0.675V may not be optimal, and it might be preferable in this example to shift Vref downward to better center Vref nearer to the centroid of the area encompassed by the eye (e.g., at Vref'=0.67). Because the eye is wider at this Vref' point, the timing margins are improved, and sensing is eased at the receivers.

However, because the Vref generator 20 only allows Vref to scale with Vddq in accordance with a given slope m, per Equation 1 above, Vref generator 20 simply won't allow Vref to be optimized for both the non-degraded and degraded cases. This could impede the sensing operation in either of these cases, and thus presents a shortcoming in the design of the Vref generator 20.

The inventor has realized that providing such optimization of Vref requires the use of a generator in which both the Vref-to-Vddq slope m, and its offset or intercept b, can be independently varied, and embodiments of such a Vref generator are provided in this disclosure.

DETAILED DESCRIPTION

An improved reference voltage (Vref) generator useable for example in sensing data on single-ended channels is disclosed. The Vref generator can be placed on the integrated circuit containing the receivers, or may be placed off chip. In one embodiment, the Vref generator comprises an adjustable-resistance voltage divider in combination with a current source. The voltage divider is referenced to I/O power supplies Vddq and Vssq, with Vref being generated at a node intervening between the adjustable resistances of the voltage divider. The current source injects a current into the Vref node and into a non-varying Thevenin equivalent resistance formed of the same resistors used in the voltage divider. So constructed, the voltage generated equals the sum of two terms: a first term comprising the slope between Vref and Vddq, and a second term comprising a Vref offset. Each of these terms can be independently adjusted in first and second modes: the slope term via the voltage divider, and the offset term by the magnitude of the injected current. Use of the disclosed Vref generator in one useful implementation allows Vref to be optimized at two different values for Vddq.

Figure 1:
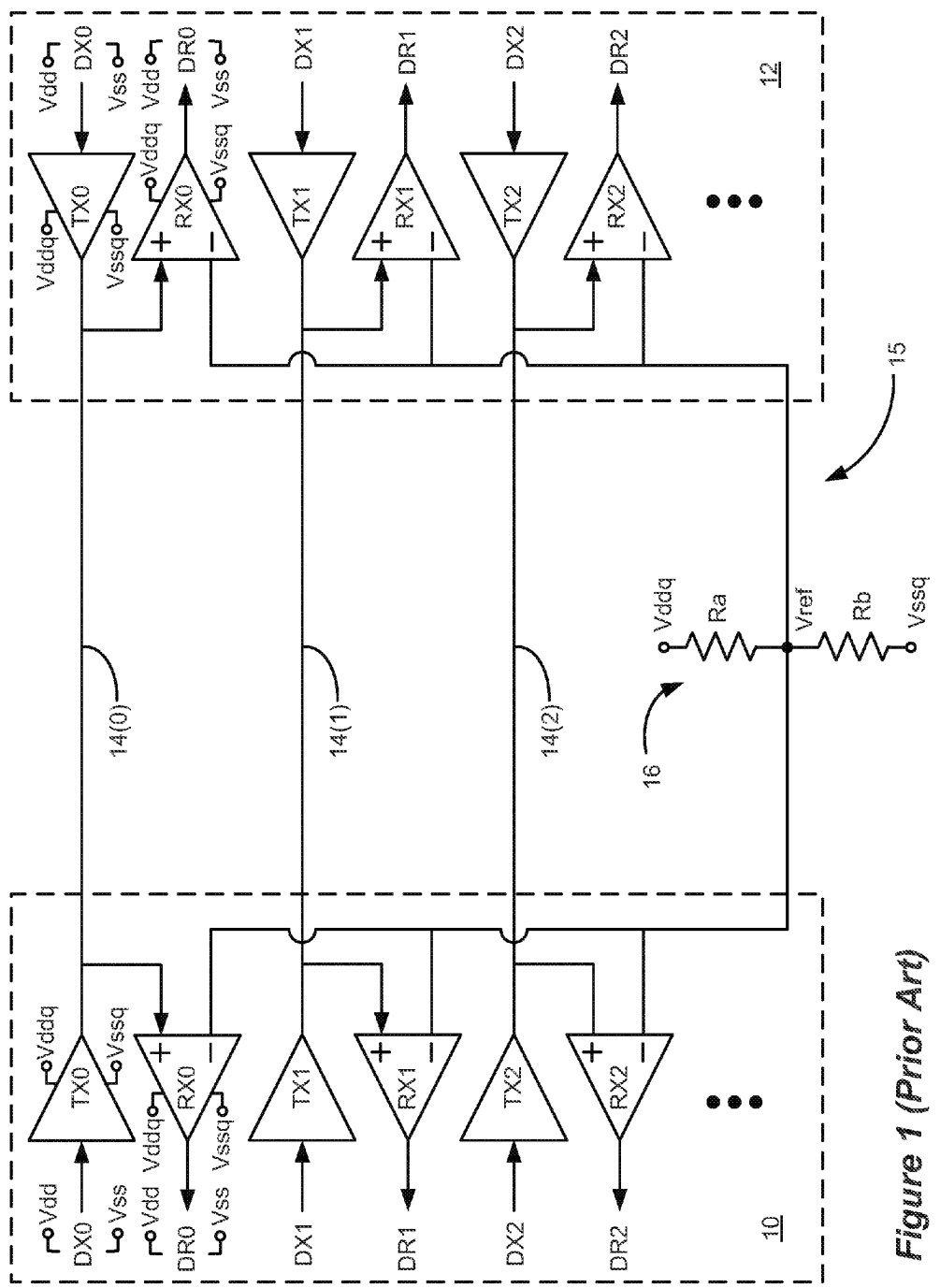
FIG. 1 illustrates a prior art data transmission system, and a prior art reference voltage (Vref) generator for providing a voltage to single-ended data receivers.
Figure 2:
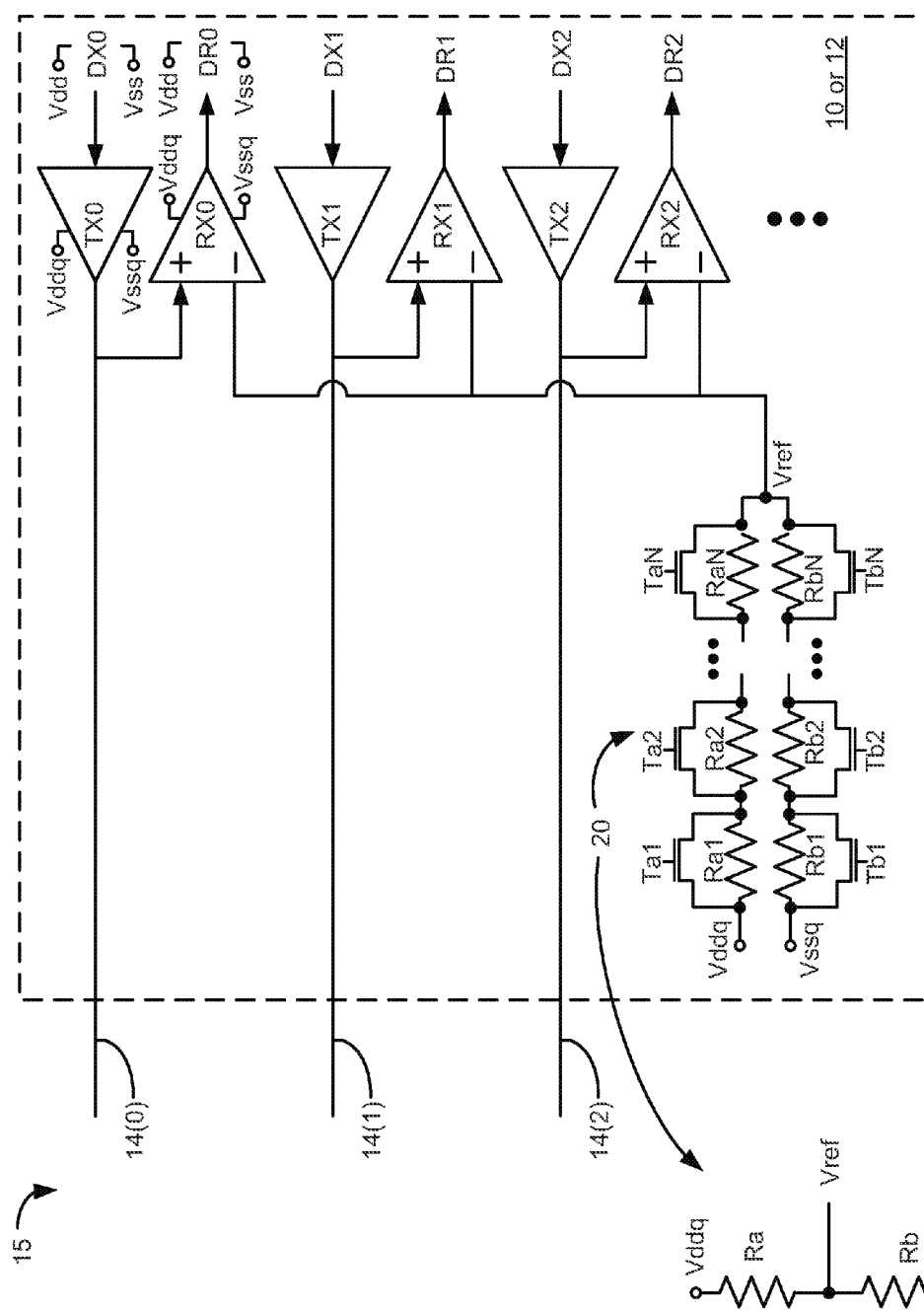
FIG. 2 illustrates another prior art Vref generator which is tunable and on-chip.
Figure 3:
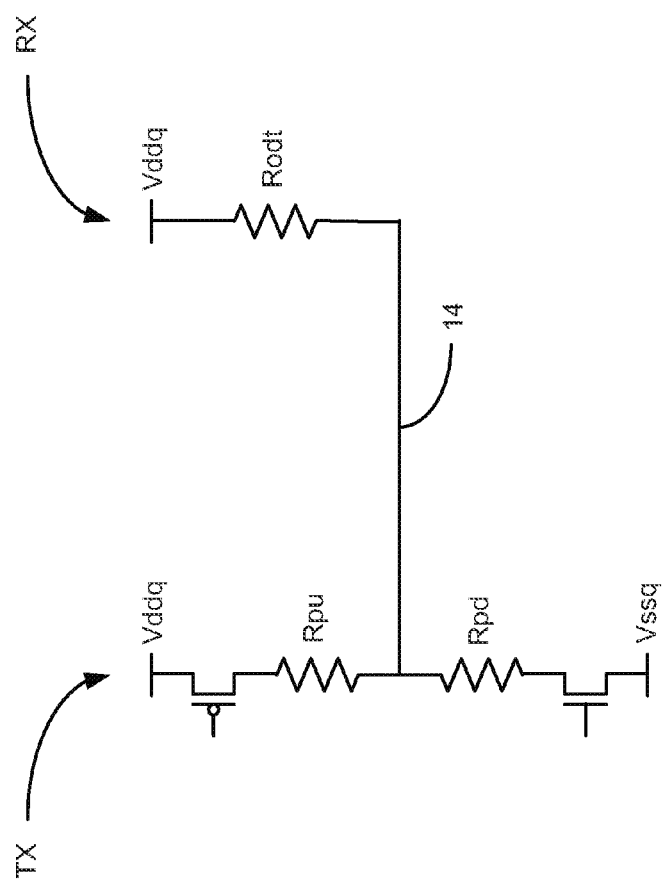
FIG. 3 illustrates the resistances involved in transmitting Vddq-referenced signals according to the prior art.
Figure 5:
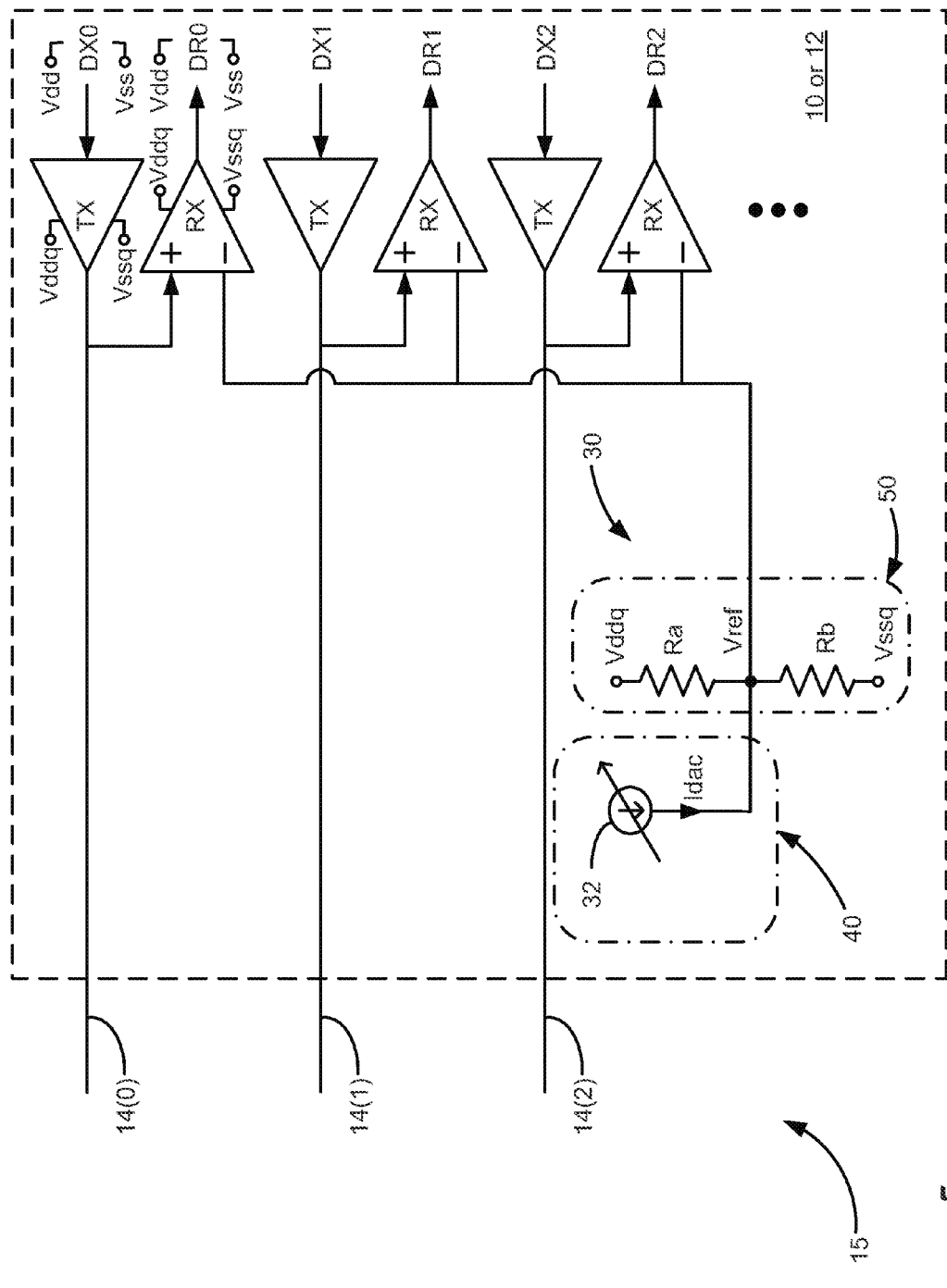
FIG. 5 illustrates an embodiment of the inventor's improved Vref generator, which includes a current generation stage and a resistor stage.

FIG. 5 shows an improved Vref generator 30 which solves the previously mention problems with the prior art. As shown, the generated Vref voltage is formed at a node between two resistances Ra and Rb which form a voltage divider between I/O power supplies Vddq and Vssq. As will be discussed further below, each of these resistances Ra and Rb can comprise an adjustable resistance formed by a parallel network of resistors. Also included in Vref generator 30 is a current source 32 for injecting a current, Idac, into the Vref node. As will be discussed below, Idac is also adjustable. As with the prior art, the generated voltage Vref is again coupled to one input of each of the single-ended, pseudo-differential receivers RX in either of the devices 10 or 12 coupled to the communication channels 14(x). As illustrated, the Vref generator 30 is formed on-chip, i.e., internal to devices 10 or 12, which is consistent with evolving DDR standards and which saves the hassle of having to provide an external Vref connection at each of devices 10 and 12. However, this is not strictly necessary, and Vref generator 30 could also reside off-chip, similar to generator 16 shown in FIG. 1 for example.

Operation of the Vref generator 30 can be appreciated by summing the currents at the Vref node:

$$[(Vddq-Vref)/Ra]+Idac-(Vref/Rb)=0 \quad \text{(Eq. 3)}$$

Solving this equation for Vref yields:

$$Vref=(Ra\|Rb)*[(Vddq/Ra)-Idac] \quad \text{(Eq. 4)}$$

or $$Vref=[Rb/(Ra+Rb)]*Vddq-(Ra\|Rb)*Idac=m*Vddq+b \quad \text{(Eq. 5)}$$

Thus, Vref so generated can be viewed as a sum of two terms: a slope term [Rb/(Ra+Rb)]*Vddq which relates Vddq and Vref in accordance with a slope m=[Rb/(Ra+Rb)], and an offset term b=−(Ra∥Rb)*Idac.

Figure 6:
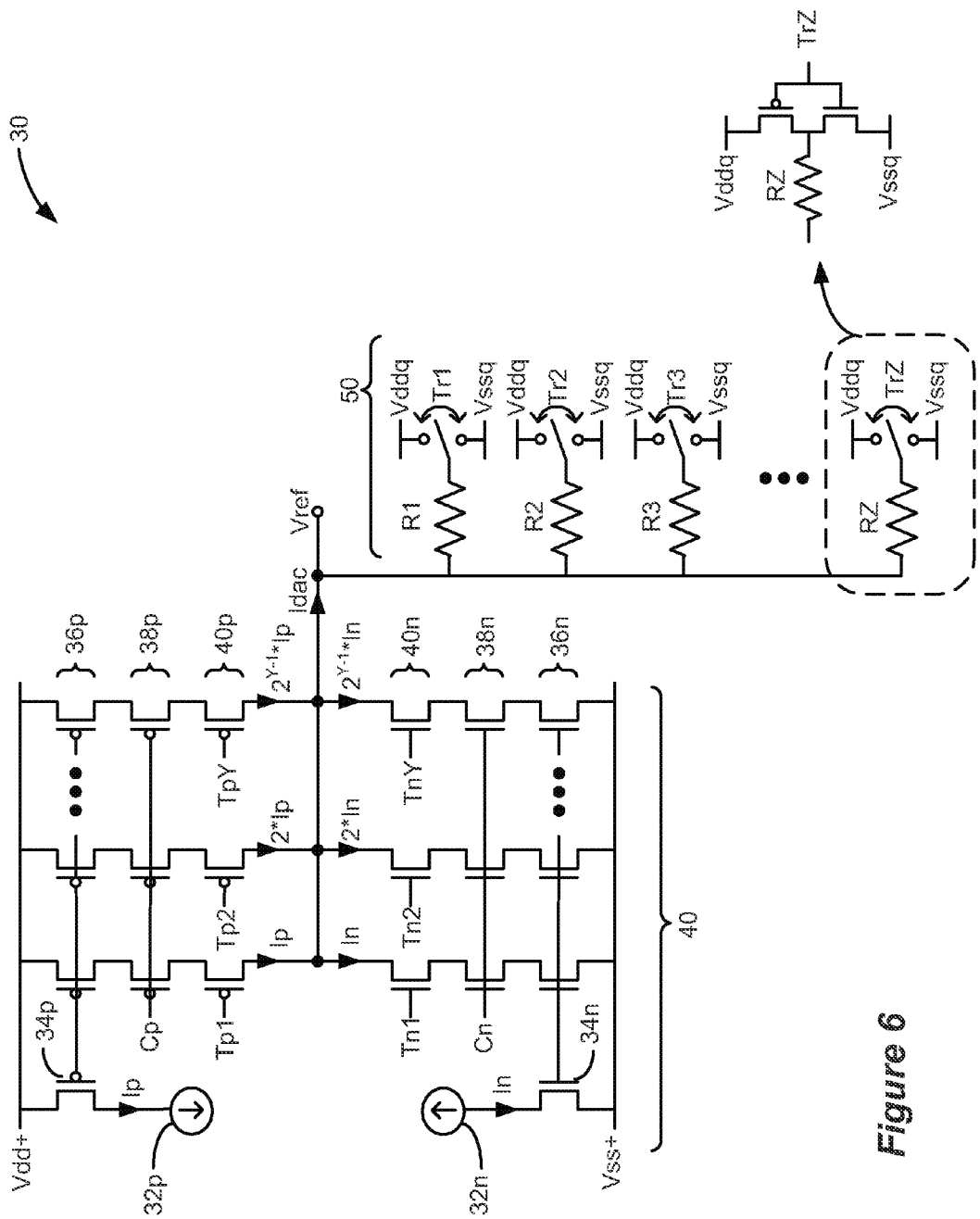
FIG. 6 illustrates further circuit details for the Vref generator of FIG. 5.

Before explaining these two terms, further details concerning the circuitry for the Vref generator 30 are shown in FIG. 6. As shown, the generator comprises two stages: a current generation stage 40, and a resistor network stage 50. The current generation stage 40 essentially comprises a programmable current source for processes two reference currents, Ip and In, to ultimately produce an overall current output, Idac. The reference currents Ip and In are produced by current sources 32a and 32b, which are very stable and may comprise bandgap reference circuits for example. Each current Ip and In respectively feeds into Y PMOS and Y NMOS-based legs formed of transistors 36p-40p and 36n-40n, respectively. Specifically, transistor 34p forms current mirrors with each of transistors 36p in the Y PMOS legs, and transistor 34n forms current mirrors with transistors 36n in the Y NMOS legs.

Each leg can contribute its current to the overall current produced by the current generation stage 40, Idac, upon the selection of that leg. Specifically, digital control signals Tp1-TpY (active low) are used to turn on transistors 40p to select any of the Y PMOS legs, while control signals Tn1-TnY (active high) are used to select any of the Y NMOS legs. By appropriate sizing of the transistors in the leg, relative to the current mirror transistors 34p and 34n, each leg can contribute differing amounts of current.

For example, as shown in FIG. 6, the first PMOS leg, upon selection of Tp1, contributes Ip to the overall current, the same amount as that provided by current source 32p. The next leg, upon selection of Tp2, contributes double that amount (2*Ip), and so on. This allows the overall current Idac to be comprised of any integer value of Ip: if Tp1-Tpy=<100 . . . 0>, then Idac=Ip; if Tp1-TpY=<010 . . . 0>, then Idac=2Ip; if Tp1-Tpy=<110 . . . 0>, then Idac=3Ip, and so on. Cascode devices 38p are inserted into each PMOS leg to increase the output impedance, in conjunction with analog control signal, Cp. Increased output impedance provides several benefits. For example, so long as the output impedance of the current generation stage 40 is much larger than the equivalent resistance of the resistor stage 50, then the current generation stage 40 can be ignored in the equations governing the Vref generator operation, as has been done. Another advantage of high output impedance is increased linearity in the current variation, which leads to equal step sizes in the Vref level tuning functionality, yet to be described. To accommodate such cascode devices, the current generation stage 40 may be powered using a higher voltage supply (Vdd+) to increase headroom, but this is not strictly necessary.

This same scheme is also used in the NMOS legs, but with two differences. First, the current provided by each NMOS leg is opposite the polarity of the current provided by the PMOS legs, meaning that selection of a given NMOS leg will subtract from the total current, Idac. Second, the currents in the NMOS legs are comparatively smaller to counterparts in the PMOS legs. This results by setting In<Ip in the current sources 32p and 32n, which can be achieved by appropriate transistor sizing. In one example, Ip=150 microamps, while In=20 microamps. So configured, the current generation stage 40 provides coarse positive current adjustment (via control signals Tp1-TpY), and fine negative current adjustment (via control signals Tn1-TnY), allowing output current Idac supplied to the Vref node to be finely digitally controlled. However, it should be realized that FIG. 6 illustrates only one possible circuit for the current generation stage, and any other programmable current source may be used. Moreover, it is not strictly necessary to allow for both positive and negative adjustment of the current. Therefore, in certain designs in which adjustment of the current in only one direction is desirable, either the PMOS or the NMOS portions of the current generation stage 40 could be omitted.

It may also be beneficial, in some circumstances (Vssq-referenced signaling for example), to invert the characteristics of the PMOS legs and the NMOS legs, such that the PMOS legs provide fine offset tuning while the NMOS legs provide coarse offset tuning. This could be accomplished by reducing the channel widths of the PMOS legs while increasing the channel widths of the NMOS legs. It is also not strictly necessary that the smallest of the PMOS and NMOS legs match their respective reference legs (Ip and In) in terms of channel width. To reduce the static current draw of the reference current legs, the channel widths of both of the Ip and In legs could be reduced, without altering the currents in the PMOS and NMOS legs. This could be done by increasing the channel widths of the PMOS and NMOS legs with respect to the Ip and In legs, resulting in current scaling, a common practice when using current mirror circuit architectures.

Figure 7:
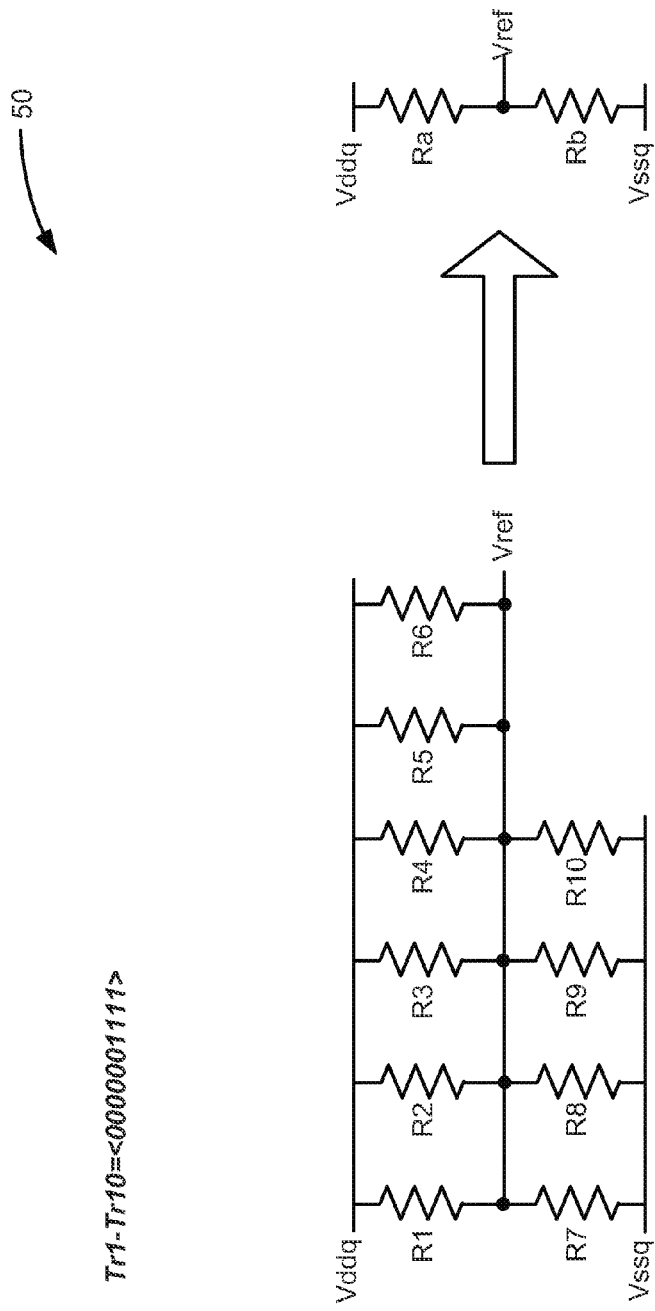
FIG. 7 illustrates the setting of the resistors in the resistor stage.

The resistor stage 50 comprises Z resistors, each coupled at one end to the Vref node, and coupleable at their other ends to either Vddq or Vssq depending on the status of resistor selection signals Tr1-TrZ. This is shown in FIG. 7, which assumes the use of ten 10 kΩ resistors as an example. As shown, when particular resistor selection signals are low (e.g., Tr1-Tr6), the corresponding resistors (R1-R6) are coupled to Vddq. By contrast, when particular resistor selection signals are high (e.g., Tr7-Tr10), the corresponding resistors (R7-R10) are coupled to Vssq. The equivalent circuit comprises a voltage divider comprising Ra (the paralleled resistances to Vddq of R1-R6) and Rb (the paralleled resistances to Vssq of R7-R10). If each of the resistors is 10 kΩ, Ra in this example would be equal to 1.667 kΩ, while Rb would be equal to 2.5 kΩ.

In the case of Vddq-referenced signaling, appropriate initial values for Ra and Rb (prior to optimization by contribution from Idac, i.e., when Idac=0) can be calculated by equating the optimal Vref, taking into account the various resistances in the communication channel (Eq. 2), with the Vref provided by Vref generator 30 (Eq. 5):

$$(Rpd+0.5Rodt)/(Rpd+Rodt)*Vddq=[Rb/(Ra+Rb)]*Vddq-(Ra\|Rb)*Idac \quad \text{(Eq. 6)}$$

and solving for Ra and Rb (when Idac=0). This yields:

$$Ra=0.5Rodt; \text{ and}$$

$$Rb=Rpd+0.5Rodt \quad \text{(Eqs. 7)}$$

Once initial values for Ra and Rb have been chosen, an appropriate number of the resistors in the resistor stage 50 can be paralleled, as shown in FIG. 7, to best approximate the desired values. Then if necessary, Vref can be further varied by varying Idac, a subject to which this disclosure now returns.

As noted earlier with respect to Equation 5, reproduced below, the relationship of Vref and Vddq as produced by the disclosed Vref generator 30 of FIGS. 5 and 6 is expressible as the following linear relationship:

$$V\text{ref}=[Rb/(Ra+Rb)]*Vddq-(Ra\|Rb)*Idac=m*Vddq+b \quad \text{(Eq. 5)}$$

where m equals the slope (m=[Rb/(Ra+Rb)]) and b equals the offset or intercept (b=−(Ra∥Rb)*Idac).

Therefore, in contradistinction to the prior art, which contained only a slope term (see Eq. 1), the disclosed Vref generator 30 provides increased flexibility in setting an appropriate Vref by virtue of the offset term, b. Moreover, this offset, b, can be tailored independently from the slope, m.

The slope, m, is tailored by picking appropriate resistances, Ra and Rb, which as noted previously can be achieved by coupling an appropriate number of resistors R1-RZ in the resistor stage 50 (see FIG. 7) to either Vddq or Vssq.

By contrast, the offset, b, is tailored only by changing the amount of current, Idac, injected into the Vref node. This is because the resistance factor in the offset, Ra∥Rb, can be designed to exhibit a constant Thevenin equivalent resistance, which does not change when the connections to Vddq and Vssq are changed. In other words, this equivalent resistance comprises the paralleled resistance of all of the resistors R1-RZ in the resistor stage 50, and when resistors R1-RZ are equal in their individual values, then the equivalent resistance looking into the Vref node will always be any one resistor's resistance divided by the number of resistors, regardless of the supply to which they are tied for the purpose of determining slope, m. When this is understood, Equation 5 can be rewritten as follows:

$$V\text{ref}=[Rb/(Ra+Rb)]*Vddq-(R1\|R2\|R3\|\ldots RZ)*Idac=m*Vddq+b \quad \text{(Eq. 8)}$$

wherein the offset or intercept is now rewritten as b=−(R1∥R2∥R3∥ . . . RZ)*Idac. Because the values of R1-RZ are fixed, only the current produced by the current generation stage 40, Idac, varies the offset, b. If ten 10 kΩ resistors are assumed, as discussed previous with respect to FIG. 7, then R1∥R2∥R3∥ . . . R10=1 kΩ, and this offset term can be written as b=−1000*Idac.

Figure 4:
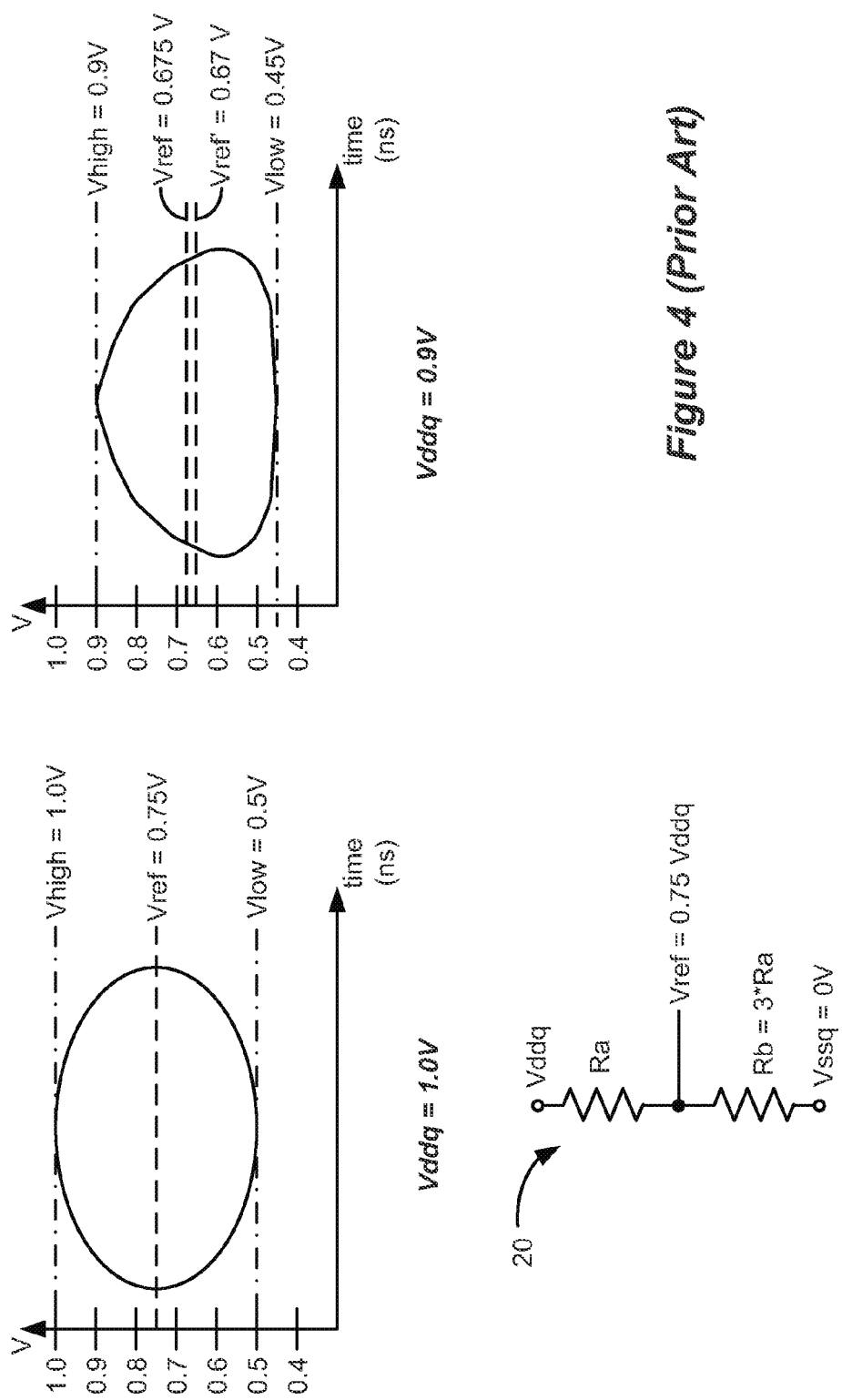
FIG. 4 illustrates two hypothetical data eyes each produced at two different Vddq conditions, and illustrates problems with simultaneously optimizing Vref at both conditions.

Consider now how the improved Vref generator 30 can be used to solve the problem presented by FIG. 4. As discussed earlier, that figure shows a first symmetrical data eye, with the high end of the swing equaling Vhigh=1.0V, the low end equaling Vlow=0.5V, and with an optimal Vref ideally set between these two extremes at Vref=0.75V. Assume again that the system degrades at Vddq=0.9V as shown in the second non-symmetrical data eye. As illustrated there, an optimal reference voltage, Vref', might not necessarily be the midpoint voltage between the high and low swing (i.e., 0.675 V). Instead, an alternative reference, e.g., Vref'=0.67V, might be optimal or at least better.

Although the prior art Vref generator 20 could not simultaneously handle optimization at both of these extremes of Vddq, the disclosed Vref generator 30 can. Doing so involves, for example, solving a system of equations for the two (presumably extreme) conditions:

$$V\text{ref}=m*Vddq+b$$

$$0.75=m*1+b$$

$$0.67=m*0.9+b \quad \text{(Eqs. 9)}$$

When this system is solved, m=0.9, and b=−0.14. If it is assumed that ten 10 kΩ resistors R1-R10 are used, then Idac=−b/1000, =0.14 mA, or 140 microamps. To provide the 140 microamps, three of the NMOS legs (20 uA+40 uA+80 uA) in the current generation stage 40 of FIG. 6 must be enabled, while all PMOS legs remain disabled. This could be accomplished using the following control signals: Tp1-TpY=<000 . . . 0> and Tn1-TnY=<111 . . . 0>. Of course, different current values for Idac would require different assertions of these control signals Likewise, because m=0.9=[Rb/(Ra+Rb)], and then Rb can be set to Rb=9*Ra. Such resistances can roughly be achieved in the resistor stage 50 (FIG. 7) by tying nine of the resistors (R1-R9) to Vssq and tying the remaining resistor R10 to Vddq. In other words, the control signals in the resistor stage 50 are set to Tr1-Tr10=<1000000000>. Of course, should it be desired to provide finer resistance tuning, more resistors can be used in the resistor stage 50.

To summarize, setting control signals Tp1-TpY=<100 . . . 0>, Ttn1-TnY=<000 . . . 0>, and Tr1-Tr10=<1000000000> results in Vref generation in accordance with the following relationship:

$$V\text{ref}=0.9*Vddq-0.14 \quad \text{(Eq. 10)}$$

which optimizes Vref at each of the Vddq conditions illustrated in FIG. 4. Again, such simultaneous optimization of Vref was not possible using the Vref generator of the prior art, which lacks the flexibility to tune the Vref voltage independent of Vddq.

Figure 8:
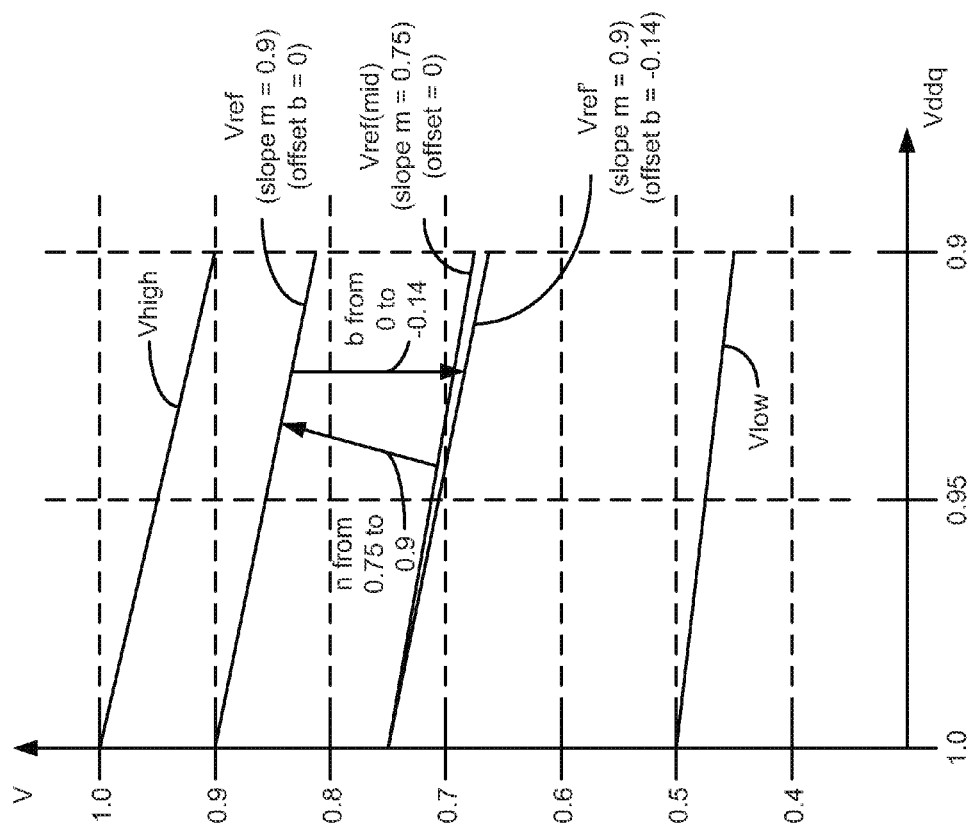
FIG. 8 graphically illustrates optimization of Vref at two different values for Vddq

FIG. 8 shows this optimization of Vref in graphical form. The process can be viewed by initially assuming that the best value for Vref will be at the midpoint between Vhigh and Vlow, such that in our example Vref=0.75*Vddq. However, as illustrated in FIG. 4, that is not necessarily the case. Accordingly, variance from this initial assumption is had by varying the slope m and the offset b to 0.9 and −0.14 in accordance with Equation 10. Viewed as two separate modes, and viewing the slope adjustment mode first in FIG. 8 by following the arrows, we see the effect that the increase in slope from 0.75 to 0.9 has. At this point, only the slope has changed, i.e., only the values Ra and Rb in the slope term of Equation 8. Then, following the next arrow, the −0.14 offset b is asserted as a second adjustment mode, which is done by varying the Idac current from 0 to 140 microamps as stated earlier.

Although optimization of Vref over a range of Vddq was illustrated with the simple example of two conditions, it will be understood that more than two conditions can also be simultaneously optimized using statistical curve fitting methods, such as least squares analysis, etc.

Even apart from optimization over a range of Vddq values, the improved Vref generator 30 also provides desirable flexibility in tuning Vref. For example, it may simply be desired to experiment with particular Vref values to determine a level which provides for the most reliable sensing of data at the single-ended receivers, RX. In such a case, initial values for the resistor stage 50 can be chosen (e.g., using Eqs. 7) and with Idac=0. Then, the Idac current can be varied, both positively and negatively, to modify Vref to see if improved data sensing reliability results. Unlike the prior art, such modification to Vref can be had without simultaneously varying the slope term, i.e., the resistances Ra and Rb.

Figure 9:
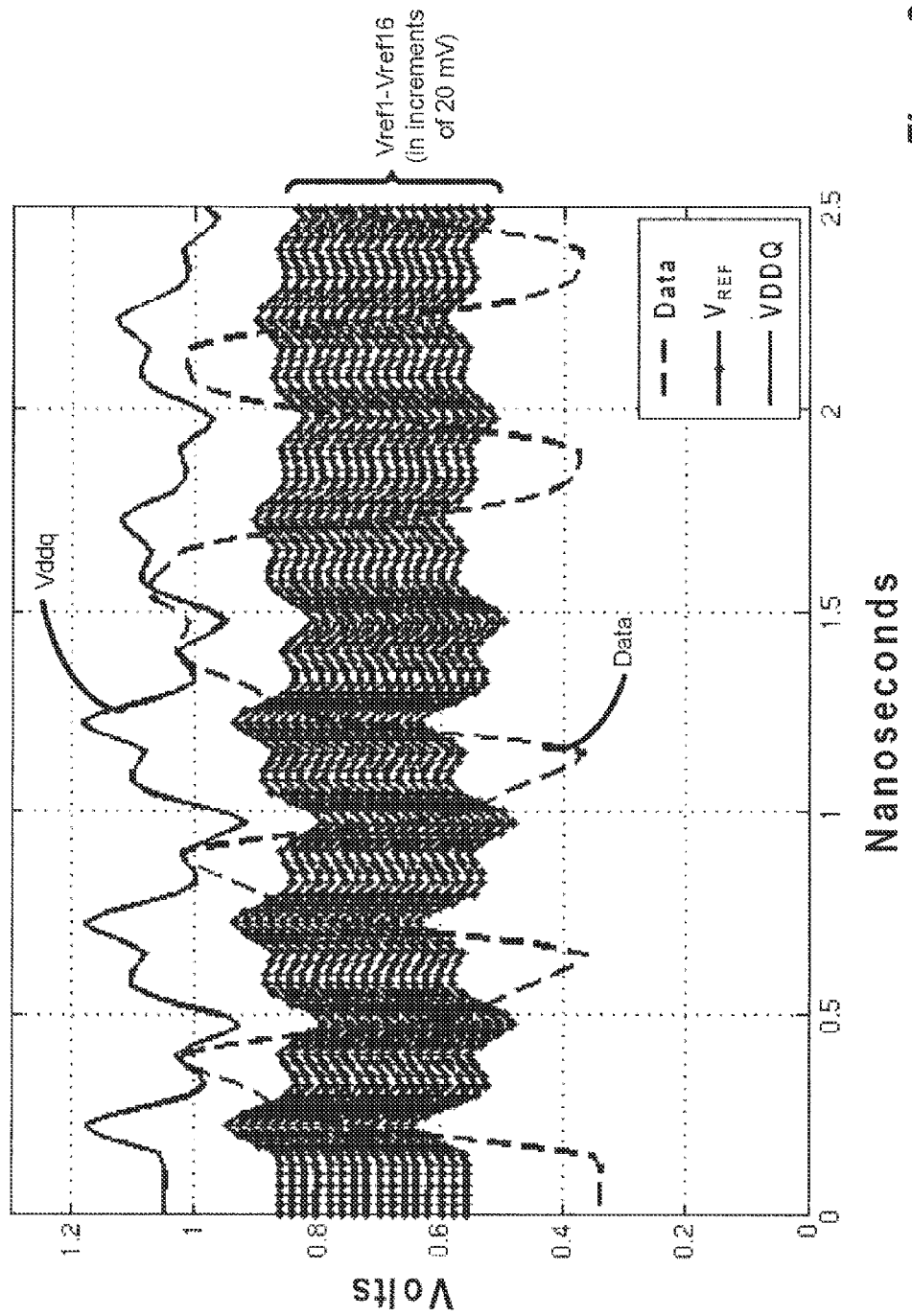
FIGS. 9 and 10 illustrate a simulation of the operation of the disclosed Vref generator.
Figure 10:
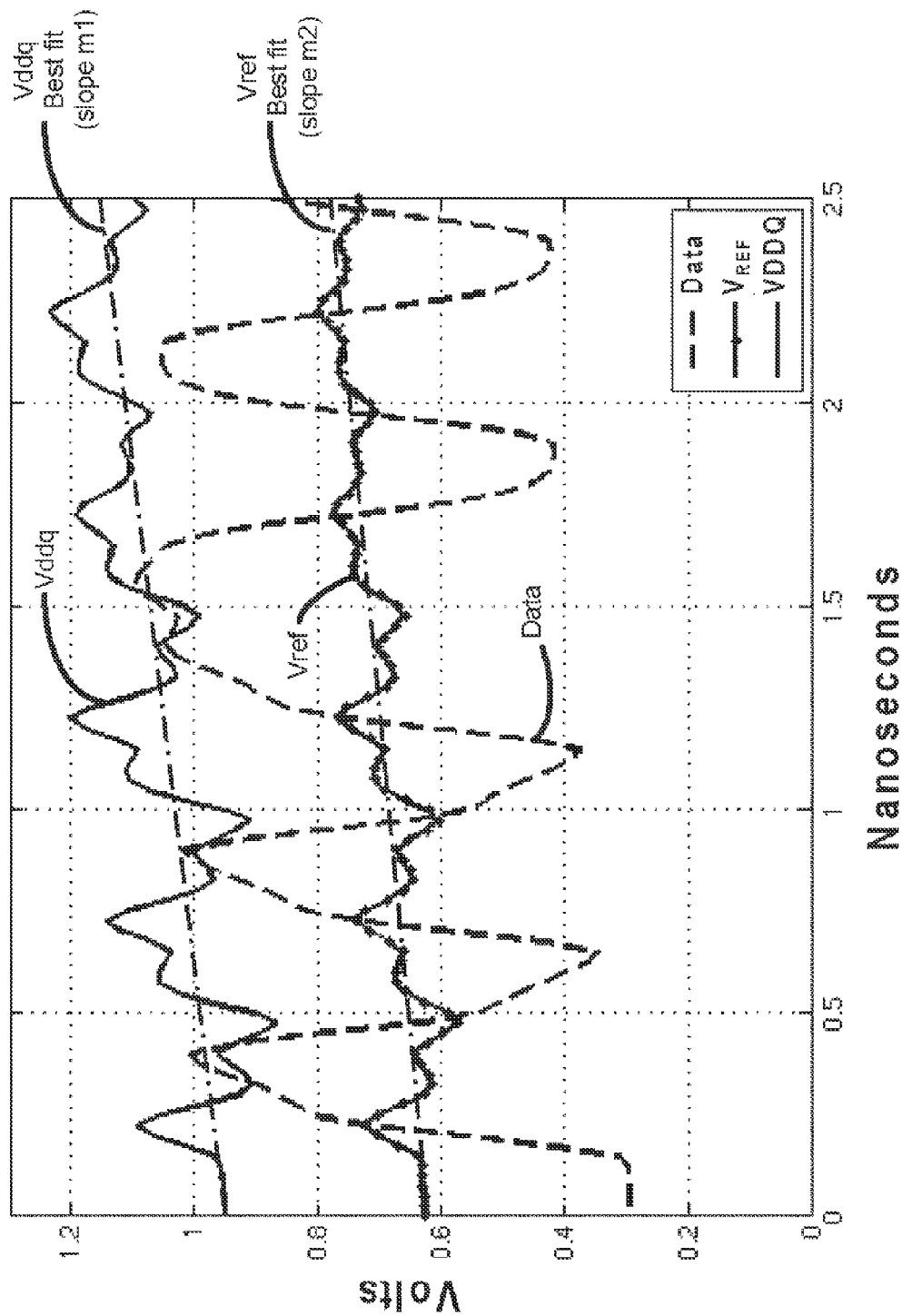

FIG. 9 show simulation results of the improved Vref generator as implemented in a communication channel carrying active data. In both cases, the data varied roughly between 0.4V and 1.0V, consistent with Vddq-referenced signaling. In either case, the data as simulated causes noise in Vddq, as can happen for a variety of reasons. In FIG. 9, 16 different offset currents are used to adjust Vref to 16 different levels. Each of the Vref lines are separated by approximately 20 mV, which correlates to Idac steps of 20 microamps injected into the 1 kΩ Thevenin equivalent resistance discussed above. As would be expected, the magnitude of Vref scales with Vddq in accordance with the slope, m, and the various Vref steps do not perturb this scaling, verifying the independence with which the slope m and offset b can be varied. The scaling of Vref with Vddq can be seen more plainly in FIG. 10, which in addition to shifts due to noise, shows a more gradual and intentional increase in Vddq, and the resulting tracking of Vref in accordance with the slope m.

Although the disclosed Vref generator 30 is described in the context of the sensing of single-ended data signals in a high speed communication link, it should be noted that this generator can be used in any context in which it is beneficial to provide a reference voltage that can be adjusted independent of its power supply voltage.

Furthermore, it is not important to implementation of the technique that Vddq-referenced signaling be used, although the use of such has been helpful herein in illustrating some of the benefits of the generator. Vssq-referenced signaling, or signaling referenced to both Vddq and Vssq (common in earlier SDRAM standards) can also benefit from the invention.

The invention is also not limited to use in memory applications. Single-ended signaling is well understood and widely adopted, and thus the invention would provide benefit in many systems. It is also not limited to the bi-directional channels described herein, and would be compatible with other channel configurations, including uni-directional signaling.

In some cases, multiple instantiations of the invention might be useful. For example, single-ended data is often encoded from its nominal binary character into multi-levels signals, sometimes referred to as pulse-amplitude-modulation (PAM), where a 4-PAM signaling scheme would transmit single-ended data comprising 1 of 4 signal levels, as opposed to 2. In such cases, three different Vref levels are required within the receiver to distinguish between the 4 signal levels. The current invention would allow for all three levels to be achieved (with tunability) using the same circuit implementation.

It is also not necessary for the Vref generator circuitry described to be connected to a separate supply, Vddq, as has been described. It is simply advisable that the invention be coupled to the same supplies to which the incoming signal and receiver circuitry are connected.

It should also be noted that the resistances in the resistor stage 50 of FIG. 6 could be implemented using the on/off channel resistance of other semiconductor devices. For example, and referring to FIG. 6, the transistors controlled by control signals Tr1-TrZ could be made with relatively great channel lengths to provide the necessary resistance, in which case discrete resistors R1-RZ could be dispensed with. While semiconductor channel resistance typically exhibits nonlinearity, if linearity could be sacrificed in a given application, then the connectivity of the resistor stage 50 to either power supply could be simplified using transistors (e.g., the transistors could double as both the interconnect switch and the resistance value).

While some implementations have been disclosed, it should be understood that the disclosed circuitry can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A reference voltage generator to generate a reference voltage at a node, the reference voltage generator comprising:
   a plurality of adjustable resistances including a first adjustable resistance and a second adjustable resistance, one end of each of the first and second adjustable resistances coupled to the node, the other end of each of the first and second adjustable resistances being selectively coupleable to either a first power supply voltage or a second power supply voltage based on a control signal; and
   an adjustable current source to inject a current into the node,
   a change in a magnitude of the current to result in a change in the magnitude of the reference voltage, and
   the magnitude of the reference voltage at the node to be between the magnitude of the first power supply voltage and the magnitude of the second power supply voltage.

2. The reference voltage generator of claim 1, wherein the other end of each of the first and second adjustable resistances is selectively coupleable by a first transistor and a second transistor, the control signal being configured to be received at gates of the first and second transistors concurrently.

3. The reference voltage generator of claim 1, wherein the adjustable current source comprises a positive current source and a negative current source for respectively adding to and subtracting from the current injected into the node.

4. The reference voltage generator of claim 1, wherein the current is to can be coarsely and finely adjusted by the adjustable current source.

5. The reference voltage generator of claim 1, wherein the adjustable current source comprises at least one current mirror.

6. The reference voltage generator of claim 1, wherein the adjustable current source is to adjust the magnitude of the reference voltage independently of the magnitudes of the first power supply voltage and the second power supply voltage.

7. The reference voltage generator of claim 1, wherein the first and second adjustable resistances are to adjust the magnitude of the reference voltage relative to the magnitudes of the first power supply voltage or the second power supply voltage.

8. A reference voltage generator to generate a reference voltage at a node, the reference voltage generator comprising:
   an adjustable current source to inject a current into the node; and
   a resistance stage comprising a plurality of resistances each coupled at one end to the node, the other end of the plurality of resistances controllable to be selectively coupled to either a first power supply or a second power supply based on a control signal.

9. The reference voltage generator of claim 8, wherein the adjustable current source is not to be powered by either the first or second power supplies.

10. The reference voltage generator of claim 8, wherein the resistance stage is to vary the reference voltage at the node depending on which resistances are controlled to be coupled to the first or second power supplies.

11. The reference voltage generator of claim 10, wherein the resistance stage is to vary the reference voltage in proportion to the first or second power supply.

12. The reference voltage generator of claim 8, wherein the adjustable current source is to inject a positive or negative current into the node to adjust the reference voltage at the node.

13. The reference voltage generator of claim 8, wherein the resistance stage comprises a Thevenin equivalent resistive load for the adjustable current source of which equivalent resistance is not to vary depending on which of the plurality of resistances are controlled to be coupled to the first or second power supplies.

14. A reference voltage generator to generate a reference voltage at a node, the reference voltage generator comprising:
  an adjustable current source to inject an adjustable current into the node; and
  an adjustable voltage divider comprising a plurality of resistances each coupled at one end to the node, the other end of the plurality or resistances controllable to be selectively coupled to either a first power supply voltage or a second power supply voltage,
  the adjustable voltage divider to adjust the reference voltage relative to the first or second power supply voltage, the adjustable current to adjust the reference voltage independent of the first and second power supply voltages.

15. The reference voltage generator of claim 14, wherein the first power supply voltage is coupled to the adjustable voltage divider.

16. The reference voltage generator of claim 14, wherein the first power supply voltage is not coupled to the adjustable current source.

17. The reference voltage generator of claim 14, wherein the adjustable current is to be adjusted based at least in part on selecting at least one of a plurality of current mirror legs.

18. The reference voltage generator of claim 14, wherein the adjustable voltage divider comprises an adjustable resistance between the node and the first or the second power supply voltage.

19. The reference voltage generator of claim 14, wherein the plurality of resistances comprise a plurality of resistors.

20. The reference voltage generator of claim 14, wherein the plurality of resistances comprise a plurality of transistors.

21. A receiver, comprising:
  an amplifier having a first input to receive data from a communication channel comprising a plurality of resistances each coupled at one end to a same node, the data to be referenced to at least one of a high power supply voltage and a low power supply voltage, the amplifier further having a second input to receive a reference voltage, and at least one output to provide an outcome of comparison of a voltage of the data to the reference voltage,
  the reference voltage being adjustable in first and second modes, the first mode is to adjust the reference voltage relative to at least one of the high or low power supply voltages, the adjusting of the reference voltage comprising selectively coupling the other end of a corresponding one of the plurality of resistances to either the high power supply voltage or the low power supply voltage based on a control signal, the second mode is to adjust the reference voltage independently of the high or low power supply voltages.

22. The receiver of claim 21, wherein the communication channel is external to an integrated circuit including the receiver.

23. The receiver of claim 21, wherein the second mode is to adjust the reference voltage up or down based at least in part on by adding to or subtracting from a current injected into the same node having the reference voltage.

24. The receiver of claim 23, wherein the current is to be coarsely and finely adjusted in the second mode.

25. A method of producing a reference voltage, the method comprising:
  determining, for a signal to be sensed, a relationship between the reference voltage and a power supply voltage;
  applying, as the power supply voltage, at least one power supply voltage to a reference voltage generator; and
  programming the reference voltage generator to produce at a reference voltage node a reference voltage value configured to vary with the at least one power supply voltage applied in accordance with the relationship, the reference voltage node comprising a center point in a voltage divider, programming the reference voltage generator comprises adjusting a current delivered to the reference voltage node, and adjusting resistance in the voltage divider via at least one control signal, wherein the at least one power supply voltage comprises a first power supply voltage and a second power supply voltage, wherein the adjusting of the resistance in the voltage divider comprises adjusting a first resistance between the reference voltage node and the first power supply voltage, or adjusting a second resistance between the reference voltage node and the second power supply voltage, or both.

26. The method of claim 25, wherein the adjusting of the current is to raise or lower the reference voltage value.

27. The method of claim 26, wherein the current is independent of the at least one power supply voltage.

28. The method of claim 26, wherein an amount the reference voltage value to be raised or lowered by is independent of the at least one power supply voltage.

* * * * *

UNITED STATES PATENT AND TRADEMARK OFFICE
CERTIFICATE OF CORRECTION

PATENT NO. : 8,564,274 B2  
APPLICATION NO. : 12/359299  
DATED : October 22, 2013  
INVENTOR(S) : Dragos Dimitriu et al.

Page 1 of 1

It is certified that error appears in the above-identified patent and that said Letters Patent is hereby corrected as shown below:

In the Claims

In column 10, line 28, in Claim 4, after "to" delete "can".

In column 12, line 12, in Claim 23, after "on" delete "by".

Signed and Sealed this
Twenty-eighth Day of January, 2014

Michelle K. Lee
*Deputy Director of the United States Patent and Trademark Office*